(12) United States Patent
Schoner

(10) Patent No.: US 7,852,160 B2
(45) Date of Patent: Dec. 14, 2010

(54) NCO BASED TIMEBASE RECOVERY SYSTEM AND METHOD FOR A/V DECODER

(75) Inventor: Brian Schoner, Fremont, CA (US)

(73) Assignee: Broadcom Corporation, Irvine, CA (US)

( * ) Notice: Subject to any disclaimer, the term of this patent is extended or adjusted under 35 U.S.C. 154(b) by 804 days.

(21) Appl. No.: 11/178,567

(22) Filed: Jul. 11, 2005

(65) Prior Publication Data

US 2005/0249212 A1 Nov. 10, 2005

Related U.S. Application Data

(60) Division of application No. 10/313,237, filed on Dec. 5, 2002, now Pat. No. 6,917,247, which is a continuation-in-part of application No. 10/133,461, filed on Apr. 26, 2002, now Pat. No. 6,954,114.

(60) Provisional application No. 60/420,136, filed on Oct. 22, 2002.

(51) Int. Cl.
*H03L 7/00* (2006.01)

(52) U.S. Cl. .......... 331/18; 331/1 A; 375/376; 348/512

(58) Field of Classification Search .......... 331/18, 331/1 A; 375/376; 348/512
See application file for complete search history.

(56) References Cited

U.S. PATENT DOCUMENTS 5,898,744 A * 4/1999 Kimbrow et al. ............ 375/376
6,801,591 B1 * 10/2004 Frencken .................... 375/373

* cited by examiner

*Primary Examiner*—Joseph Chang
(74) *Attorney, Agent, or Firm*—McAndrews Held & Malloy, Ltd.

(57) ABSTRACT

Systems and methods are disclosed for recovering a clock or time reference for A/V systems. One method comprises receiving at least one input time reference generated using a first clock and generating, using a second clock asynchronous to the first clock, at least one time reference value representative of the at least one input time reference. The method further comprises outputting the generated time reference value used by the A/V system.

17 Claims, 9 Drawing Sheets

NCO BASED TIMEBASE RECOVERY SYSTEM AND METHOD FOR A/V DECODER

CROSS-REFERENCE TO RELATED APPLICATIONS

This application is a divisional application of patent application Ser. No. 10/313,237, dated Dec. 5, 2002 and titled "NCO Based Timebase Recovery System and Method for AN Decoder", which issued as U.S. Pat. No. 6,917,247 on Jul. 12, 2005, which is a continuation-in-part of U.S. patent application Ser. No. 10/133,461 filed Apr. 26, 2002 now U.S. Pat No. 6,954,114 and is related to, and claims benefit of and priority from, Provisional Application No. 60/420,136 dated Oct. 22, 2002, titled "NCO Based Timebase Recovery System and Method for A/V Decoder", the complete subject matter of each of which is incorporated herein by reference in its entirety.

FEDERALLY SPONSORED RESEARCH OR DEVELOPMENT

[Not Applicable]

SEQUENCE LISTING

[Not Applicable]

MICROFICHE/COPYRIGHT REFERENCE

[Not Applicable]

BACKGROUND OF THE INVENTION

The present invention relates to system time reference recovery devices, recovery systems and methods. More specifically, the present invention relates to such recovery devices, recovery systems and recovery methods for audio/visual decoders (alternatively referred to as "A/V decoders"), where the A/V decoders are adapted to process, decode or decompress input data streams (alternatively referred to as "input data", "input data streams" or "data streams") that are coded or compressed using a compression format.

Currently, a plurality of formats or techniques is used to compress audio-video programs for transmission and storage. See, for example, the compression standards set forth in ISO/IEC 13818-1,2,3: Information Technology-Generic Coding of Moving Pictures and Associated Audio Information: Systems, Video and Audio (alternatively referred to as "MPEG-2") including Annex D thereof (alternatively referred to as "Annex D"); ISO/IEC 11172-1,2,3: Information Technology-Generic Coding of Moving Pictures and Associated Audio for Digital Storage Media at up to about 1.5 Mbits/sec: Systems, Video and Audio (alternatively referred to as "MPEG-1"); Dolby AC-3; Motion JPEG, etc, each of which is incorporated herein by reference in its entirety.

Currently available A/V decoders generally include one or more clock devices. These clock devices ensure that the output of the audio and video samples, data or other information (collectively referred to as "data") is output at the same rate the data is received and input into the A/V decoder. For example, currently available A/V decoders are based on MPEG-2 transport of data. To ensure proper operation of such A/V decoders (and any larger A/V system incorporating such A/V decoders) the data output rate of the A/V decoder must match the data input rate of the A/V decoder to prevent overflow or underflow of the A/V decoders' buffers. This means that the output video frame rate of the A/V decoder must match its compressed input frame rate and the output audio sample rate of the A/V decoder must match its compressed input audio sample rate.

To accomplish such synchronization in an A/V system, MPEG-2 transport synchronizes the transmitter (the headend in an A/V system for example) and the receiver (the A/V decoder in an A/V system for example) using a system time clock (alternatively referred to as an "STC" and which may comprise a common 27 MHz clock for example). Further, the transmitter transmits or communicates one or more program clock references (alternatively referred to as "PCR") to the receiver. The receiver uses the one or more PCRs to synchronize itself with the transmitter.

Such synchronization in the A/V system may be accomplished using a phase-locked loop (alternatively referred to as a "PLL"). Typically the receivers include a local clock (for example, a voltage-controlled oscillator, alternatively referred to as a "VCO"). The receiver compares its local clock to the PCR. If the receiver's local clock is slower than or behind the PCR, the receiver accelerates the local clock. If the receiver's local clock is faster than or ahead of the PCR, the receiver decelerates the local clock. It is contemplated that eventually, the receiver's local clock is synchronized with the STC. Subsequently, the MPEG transport synchronizes the video and audio to the STC. It is further contemplated that most video and audio frames include a presentation time stamp (alternatively referred to as "PTS") and/or a decode time stamp (alternatively referred to as "DTS"). The receiver (the AN decoder for example) may use such PTS and/or DTS stamps to determine when to decode and display each frame relative to the STC.

It is further contemplated that the local clock (the VCO for example) is used to clock one or more audio/video digital-to-analog converters (alternatively referred to as "DACs") in the A/V decoders. Using the local clock to clock the one or more DACS ultimately determines the video frame rate and audio sample rate at the output of the A/V decoder. Since the local clock is locked to the STC, the output rates of the A/V decoder are thus locked to the transmitter.

However, A/V systems are growing more complex, requiring that AN decoders integrate more features. A complex A/V decoder may decode several streams simultaneously, requiring several different local clocks. For example one set-top box including a decoder may support two televisions. Each television may display different programs. It is contemplated that each television may be able to support picture-in-picture (alternatively referred to as "PIP"), such that each television may display two different programs simultaneously. In this example, the set-top box may also decode another program to record for future playback. It is contemplated that different local clocks are used to clock all these programs. Furthermore, a complex A/V decoder may require additional synchronous clocks for DRAM and/or internal interfaces (DVI, Ethernet and USB for example).

Typically, existing A/V decoders rely on VCOs for AV decoding and processing. Advanced A/V decoders with picture-in-picture or PIP or multiple displays may require several VCOs. However, high quality VCOs are expensive. Using a plurality of VCOs in the A/V decoder will affect its production costs and ultimately its retail price. It is contemplated that using multiple clocks (e.g., VCOs) may complicate decoder design. For example, clock balancing, static timing analysis and asynchronous data transfer in the A/V decoder are all affected by multiple clocks. Further, it is known that currently available VCOs may lock to other system clocks (which is sometimes referred to as "injection locking"). Therefore, using multiple VCOs in an A/V decoder may cause such VOC to become locked, ultimately affecting the performance of the A/V decoders.

VCOs are analog components. This means that performance of each VCO may vary depending on the temperature, process and manufacturer. This variance makes designing A/V decoders using such VCOs difficult. Additionally, sharing hardware (video scaler for example) in the A/V decoder is difficult, if such hardware is run at the STC clock rate.

Further limitations and disadvantages of conventional and traditional approaches will become apparent to one of skill in the art, through comparison of such systems with the present invention as set forth in the remainder of the present application with reference to the drawings.

BRIEF SUMMARY OF THE INVENTION

Features of the present invention may be found in an NCO based clock recovery system and method for an A/V decoder. The NCO based clock recovery system and method may be used to recover a timebase using any clock or time reference in the A/V decoder. Further, such NCO clock recovery system and method may recover a timebase from any input stream (e.g., ITU656, NTSC, MPEG) using one or more asynchronous clocks (i.e., a clock asynchronous to such timebase).

In one embodiment of the present invention, the data is output with a clock that is independent of the system time reference. Sample-rate conversion is used to match the output rate to the system time reference, such that the data rate is correct, even though the clock is different. In an alternative embodiment, the data may be output using a clock that is locked to a system time reference (i.e., similar to MPEG). In this embodiment, FIFOs and handshakes are used perform A/V decoding using a clock that is independent of the output or input clock.

One embodiment of the present invention relates to a method for recovering a clock or time reference for A/V systems. One method comprises receiving at least one input time reference generated using a first clock and generating, using a second clock that is asynchronous to the first clock, at least one time reference value representative of the at least one input time reference value. The method further comprises outputting the at least one generated time reference value. It is contemplated that this embodiment comprises using an NCO device and a digital PLL to generate the time reference value. Related embodiments comprise generating one or more NCO stepsize, where the NCO device generates the time reference values using such NCO stepsizes.

Another embodiment of the present invention relates to a method of processing data in a data stream using an A/V decoder. This embodiment comprises receiving at least one input time reference value from the data and generating at least one system time reference value. The system time reference value is compared and locked to the input time reference value. The recovered system time reference value is output.

Still another embodiment relates to a time reference recovery device. In this embodiment the recovery device comprises a comparator adapted to receive at least one timebase value from an input stream and a numerically controlled oscillator adapted to lock at least one recovered timebase signal to the timebase value.

Another embodiment relates to an A/V decoder adapted to decode data in one or more data streams. This embodiment comprises a system time reference recovery device and a rate managed output device coupled to at least the system time reference recovery device and adapted to track or manage an output of the AN decoder. In this embodiment, the recovery device comprises a comparator adapted to receive at least one timebase value from an input stream and a numerically controlled oscillator adapted to lock at least one recovered timebase signal to the timebase value.

These and other advantages and novel features of the present invention, as well as details of an illustrated embodiment thereof, will be more fully understood from the following description and drawings.

DETAILED DESCRIPTION OF THE INVENTION

The following description is made with reference to the appended figures.

As A/V decoders increase in complexity, integrating more functionality, the number of clocks in the A/V decoders increases. Some recent decoders have incorporated a plurality of clock domains. The large number of clock domains greatly complicates the back-end process of the A/V decoders, including static timing analysis (alternatively referred to as "STA"), layout, scan, clock insertion and balancing, and verification.

Figure 1:
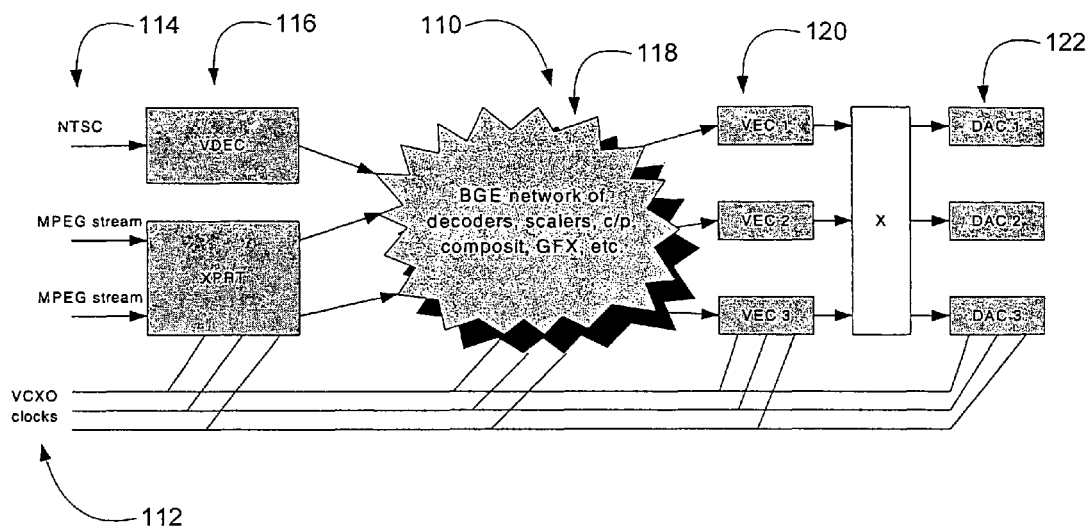
FIG. 1 illustrates a block diagram of one example of a VCXO-based video system.

FIG. 1 illustrates a block diagram of one example of a prior-art VCXO-based video system, generally designated 110. The plurality of VCXO clocks 112 is muxed into every module including the network 118, here comprised of one or more decoders, scalers, video capture & playback (alternatively referred to as "c/p"), composite, graphics (alternatively referred to as "GFX"), etc.

The input data streams 114, here comprising NTSC and one or more MPEG steams for example, use the clocks 112 for program clock reference or PCR recovery. The video decoders (alternatively referred to as "VDEC") and MPEG transport (alternatively referred to as "XPRT), both generally designated 116, use the clocks 112 for PTS comparison, while the Video encoders (alternatively referred to as "VECs") video digital to analog converters (alternatively referred to as "DACs"), generally designated 120 and 122 respectively, output data at the correct clock rates. It is contemplated that the VECs 120 and DACs 122 require considerable clock or reference muxing to support SCART/composite/component outputs. Such clock or reference muxing complicates the system 110 layout, STA, and scan. Furthermore, clock or reference muxing may cause glitches on the clocks 112.

One embodiment of the present invention relates to a method of decoding data (MPEG video for example) using an A/V system having an NCO based clock recovery system and method in accordance with the present invention. In this embodiment, system time references are recovered from one or more input data streams and the output rates are controlled using such NCO based clock recovery systems and methods. One or more audio/video decoders in the A/V decoder determine when to decode each frame compliant with MPEG standards. In this embodiment, the audio/video decoders compare a time stamp (PTS/DTS) with the system time reference. Such PTS/STR comparison is defined in the MPEG standards. Numerically controlled oscillators (alternatively referred to as "NCOs") are common digital circuits, and are used in a wide range of timing applications. It is contemplated that NCOs may be considered the digital equivalent of an analog VCO. In its simplest form, an NCO is a synchronous, fractional, digital counter. One example of a simple NCO is the Harris Semiconductor HSP45102. In one example, an NCO clocked at 27 MHz has an increment value of 1.0000 (hex). This means that the NCO increments by 27,000,000 (decimal) every second. Assuming, however, such increment value is changed to 1.0001 (hex) (i.e., equal to 1.000015 (decimal)), means the NCO increments by 27,000,411 (decimal) every second. Although the NCO remains clocked at 27 MHz, the output of the NCO is equivalent to a counter clocked at 27.000411 MHz. Changing or adjusting the NCO increment value up or down effectively accelerates or decelerates the system time clock or STC as required. It is contemplated that an NCO based clock recovery system and method in accordance with embodiments of the present invention may be used to recover a time base using any clock or time reference in the A/V system. Specifically, it is contemplated that NCOs may be used in a PLL loop similar to analog VCOs. Further, such NCO clock recovery system and method may recover a time base from any input stream (e.g., ITU656, NTSC, MPEG) using one or more asynchronous clocks (i.e., a clock asynchronous to such timebase). More specifically, the NCO may be used to recover the STC in an MPEG A/V system for example. The recovered STC may then be used by the A/V decoder for PTS/DTS comparison.

Figure 2A:
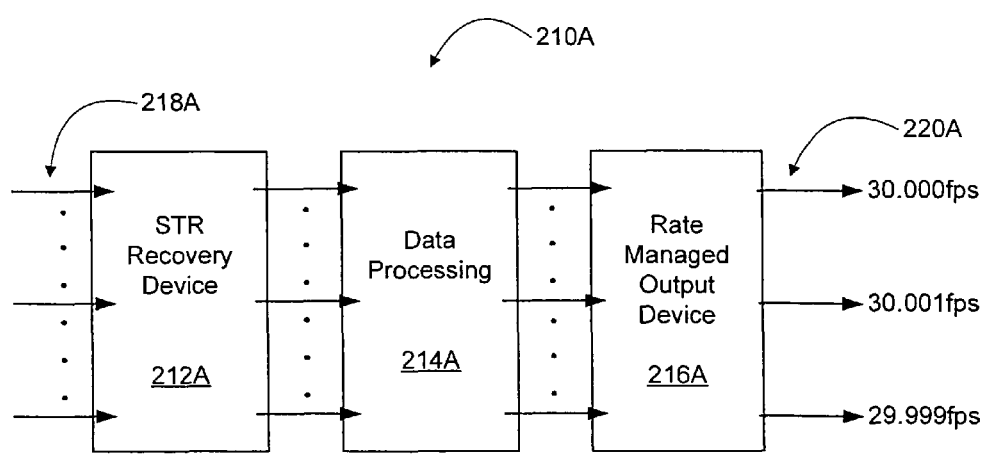
FIGS. 2A and 2B illustrate block diagrams of embodiments of an AV decoder in accordance with the present invention.
Figure 2B:
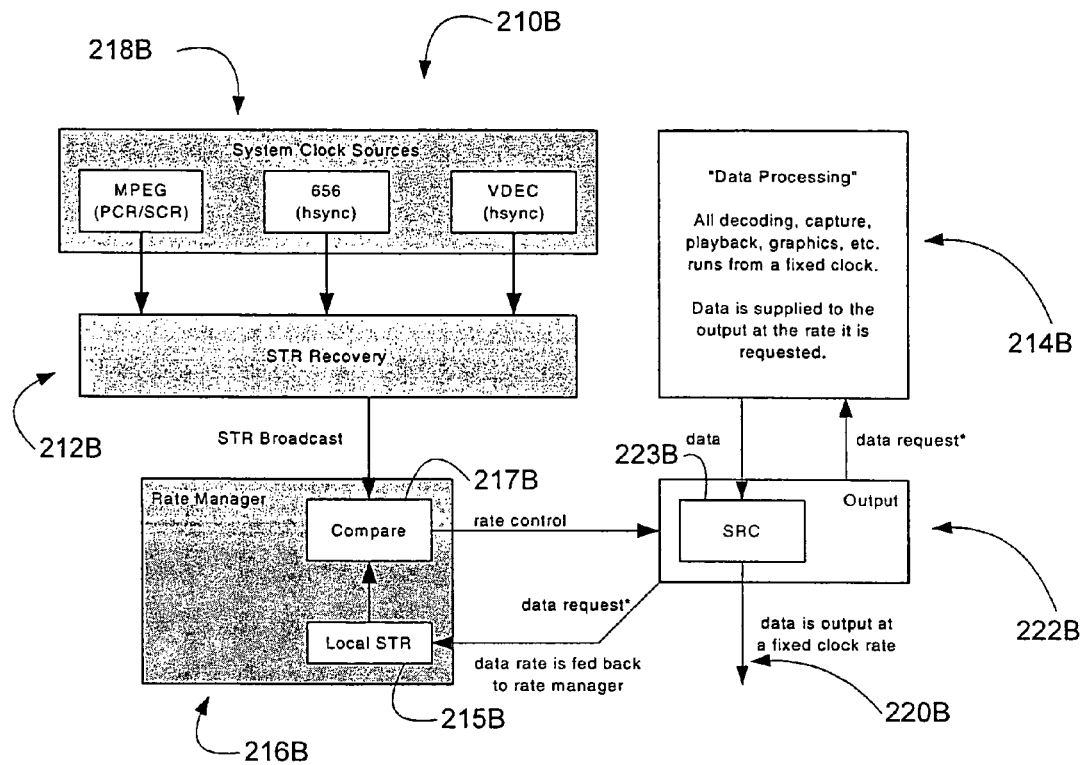

One embodiment of the present invention relates to an A/V decoder device that decodes one or more input data streams with multiple output rates using a single clock reference. This embodiment enables A/V decoders with multiple time bases to be implemented using a single clock reference (alternatively referred to as a "system clock"). FIGS. 2A and 2B illustrate block diagrams of embodiments of an A/V decoder 210 in accordance with the present invention.

In an MPEG scheme currently used in A/V decoders, the system clock is locked to the PCR. For ITU656 video for example, currently available A/V decoders outputs one pixel every 2 clock cycles. The output pixel rate is locked to the system clock, and the system clock is locked to the incoming PCR values. However, in one embodiment of the present invention, the system clock is independent of the PCR values and the output pixel rate. A video SRC (a digital sample rate converter for example) output requests pixels and data from the A/V decoder. In other words, the A/V decoder supplies pixels or data at the rate the pixels are requested (i.e., the pixels are "pulled"). Similarly the audio SRC output requests audio samples at a specified rate from the audio decoder. The audio decoder provides samples as requested (i.e., the samples are pulled).

FIG. 2A illustrates a high level block diagram of one embodiment of an A/V decoder, generally designated 210A, in accordance with one embodiment of the present invention. More detail about the A/V decoder is provided in U.S. patent application Ser. No. 10/300,371 filed Nov. 22, 2002, titled "A/V Decoder Having A Clocking Scheme That Is Independent Of Input Data Streams", the complete subject matter of which is incorporated herein by reference in its entirety. In the illustrated embodiment, the decoder 210A comprises a system time reference recovery device 212A (alternatively referred to as an "STR recovery device") having one or more input data streams 218A. It is contemplated that, in one embodiment, the STR recovery device 212A may comprise a digital PLL having or including one or more digital NCOs (where decoding multiple streams may comprise multiple PLLs) as provided below.

The STR recovery device 212A is illustrated communicating with an A/V data processing device 214A. In one embodiment of the invention, system time reference or STR refers to a reference time value, a 43-bit reference time value for example. It is anticipated that different or more complex systems are contemplated. For example if the A/V decoder 210A has more than one data source, the decoder may include more than one STR, where the number of STRs may or may not correspond to the number of data sources.

As an alternative to the MPEG scheme, an A/V system incorporating an A/V decoder in accordance with the present invention may accept analog television signals as inputs. In this embodiment, the analog video input goes through, and is processed or decoded by the A/V data processing device 214A, which may comprise a video decoder (alternatively referred to as a "VDEC"). Likewise analog audio goes through, and is processed by or decoded by the A/V data processing device 214A, which may further comprise a BTSC audio decoder (alternatively referred to as a "ADEC" or "BTSC").

In conventional decoders using VDEC/ADECs, the decoders lock the output rate to the input rate to process the data. Such conventional decoders lock a PLLNCXO to the analog video line rate, and use this clock to control the video/audio A/D conversion and the output rate. This method requires a separate, unique clock for each analog input.

One embodiment of the present invention uses a system clock (a fixed system clock for example) to control the data processing. It is contemplated that the STR recovery device 212A may be locked to the analog video line rate. The analog hysncs are converted into a psuedo-STR using a simple counter in one embodiment. The STR recovery device 212A locks to this psuedo-STR and broadcasts the recovered STR to the rest of the decoder 210A. The broadcast STR is used to control the output rates as provided previously.

FIG. 2A further illustrates a rate managed output device 216A which is illustrated as communicating with the data processing device 214A. In the illustrated embodiment, the rate managed output device 216A has one or more A/V outputs 220A (i.e., rate controlled or rate managed outputs), which are output at the same or different rates. In FIG. 2A, three A/V outputs, generally designated 220A, are illustrated. For example, one A/V output is output at 29.999 frames per second (alternatively referred to as "fps"), one is output at 30.001 fps and one is output at 30.000 fps. The plurality of outputs in this FIG. 2A illustrate that a plurality of outputs are contemplated, where each of the outputs may be at different rates and/or illustrates that one or more outputs may vary over time.

FIG. 2B illustrates a block diagram of another embodiment of an A/V decoder, generally designated 210B, in accordance with one embodiment of the present invention. In the illustrated embodiment, the decoder 210B comprises an STR recovery device 212B having one or more input data streams 218B and a STR broadcast output.

In the illustrated embodiment, the input data streams (alternatively referred to as "system clock sources" or "system reference sources") 218B comprise an MPEG (PCR/SCR) stream, a 656 (hysnc) stream and a VDEC (hysnc) stream. While three input streams are illustrated, more complex systems, having more or different input data streams are contemplated. In the illustrated embodiment, the input time references are MPEG PCR/SCR values. However, for analog video or ITU656 video inputs, the hsync timing may be used as the time reference or a fixed timing reference may be used for PVR playback.

The STR recovery device 212B is illustrated as communicating (indirectly in this embodiment) with a data processing device 214B. In one embodiment, the STR recovery device 212B controls the output data rates (in conjunction with managed out rate and SRC devices). The data processing device 214B is adapted to decode, capture, play back and produce graphics, etc. from the data inputs (i.e., the input data streams 218B) using a fixed clock or timing reference. That is the data processing devices may decode, capture, play back and produce graphics, etc. using a fixed clock (i.e., the system clock for example). In one embodiment, the data is supplied to an output device or buffer 222B as requested (i.e., the output device requests data from the data processing device or the data is "pulled"). A system and method for supporting pulling data is disclosed in U.S. patent application Ser. No. 10/300, 234 filed Nov. 20, 2002, titled "A/V System and Method Supporting A Pull Data Flow Scheme", the complete subject matter of which is incorporated herein by reference in its entirety.

A rate managed output device 216B is illustrated as communicating (indirectly in this embodiment) with at least the data processing device 214B. More specifically, the rate managed output device 216B communicates with the STR recovery device 212B and the output device 222B. In the illustrated embodiment, the rate managed output device 216B comprises at least local STR and compare devices 215B and 217B respectively, while the output device 222B comprises at least an SRC device 223B. More information about rate managed output devices is disclosed in U.S. Provisional Application No. 60/420,344 filed Oct. 22, 2002, titled "Data Rate Management System and Method for A/V Decoder", the complete subject matter of which is incorporated herein by reference in its entirety.

In one embodiment, the output device 222B outputs data 220B at a fixed clock rate (i.e., the system clock rate) as it is requested. The output device 222B submits data requests to the data processing device 214B, and thus pulls the data. The data request is also submitted or mirrored to the rate managed output device 216B, where it is compared with the STR broadcast in the compare module device 217B. A rate control signal is communicated to the output device 222B (specifically the SRC device 223B), ensuring that the data 220B is output at the fixed clock rate, and the output data rate matches the input data rate. The digital sample rate converter converts data from an input sample rate to an output sample rate. In one embodiment, the output sample rate may differ from the input sample rate. By adjusting the SRC parameters, the rate managed output device 216B changes the rate of the sample rate at the input of the SRC device 223B. This change to the sample rate changes the rate the data is requested from the data processing device 214B.

Figure 3:
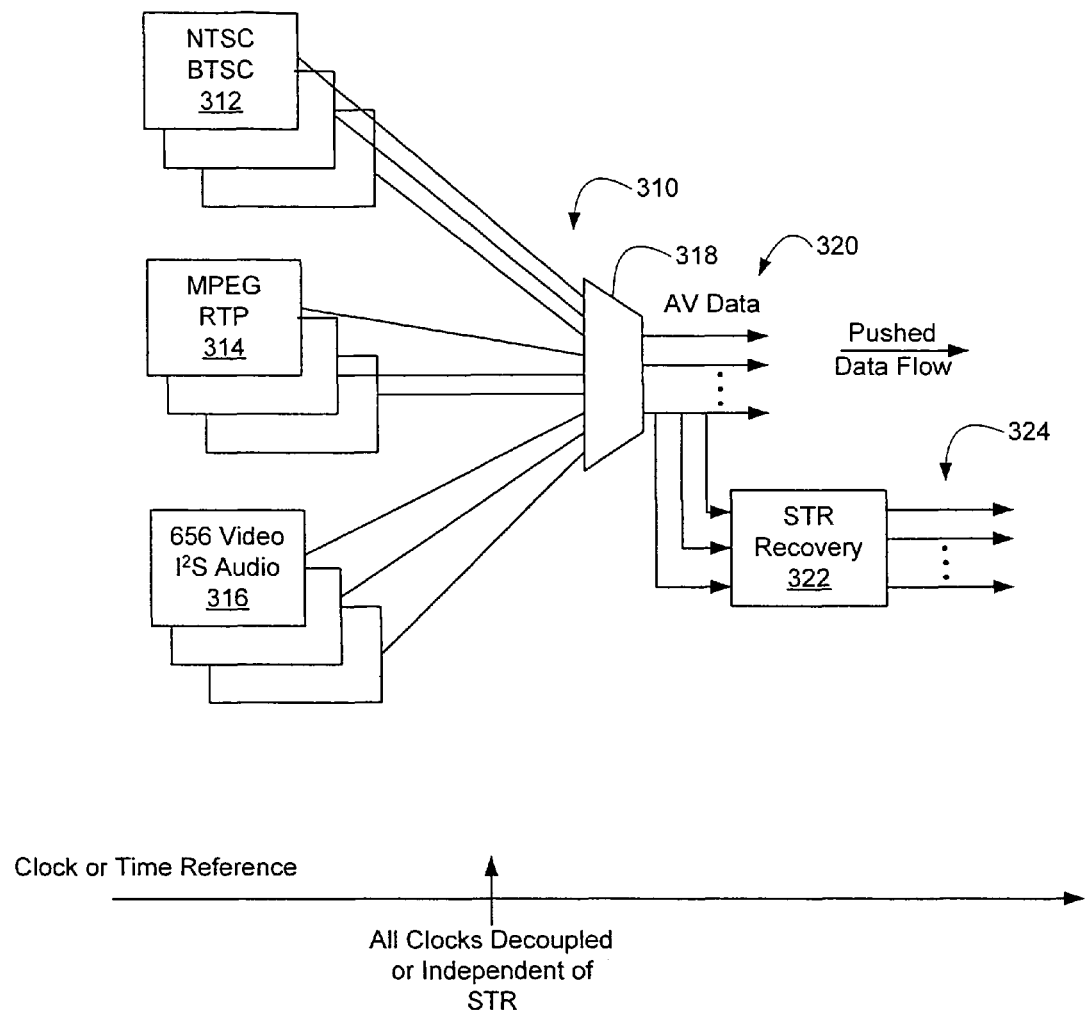
FIG. 3 illustrates a block diagram of an embodiment of the input data streams and the STR recovery device similar to that of FIGS. 2A and 2B in accordance with the present invention.

FIG. 3 illustrates a block diagram of an embodiment of the data input streams and the STR recovery device similar to that of FIGS. 2A and 2B in accordance with the present invention. A plurality of video and audio input data streams are illustrated, for example NTSC and BTSC streams, generally designated 312, MPEG and RTP streams, generally designated 314, and 656 and I²S streams, generally designated 316, are all illustrated as inputs to mux 318. While only one mux 318 is illustrated, two or more muxes are contemplated. Furthermore, while these input schemes are illustrated, other input streams, or different combinations thereof, are contemplated.

The mux 318 outputs a plurality of muxed A/V data in a pushed manner or mode, generally designated 320. It is contemplated that all the clocks associated with the input streams are decoupled or independent of the STR. The STR recovery device 322 outputs one or more system timing references recovered from the A/V data.

Conventional decoders output data with VDACs/ADACs locked to the input rate as provided previously. For example, such decoders may lock a PLLNCXO to the analog video line rate, and use this clock to control the video/audio A/D conversion. This method requires a separate, unique clock for each analog video input.

One embodiment of the present invention uses a system clock or system clock reference (a fixed system clock for example) to control the video/audio processing in the data processing device. The STR recovery device 322 is used to lock to the analog video line rate. The analog hysncs are converted into a psuedo-STR using a simple counter in one embodiment. The STR recovery device 322 locks to this psuedo-STR and broadcasts the recovered STR to the rest of the decoder. The broadcast STR is used to control (i.e., adjust or match) the output rates as provided previously.

Figure 4:
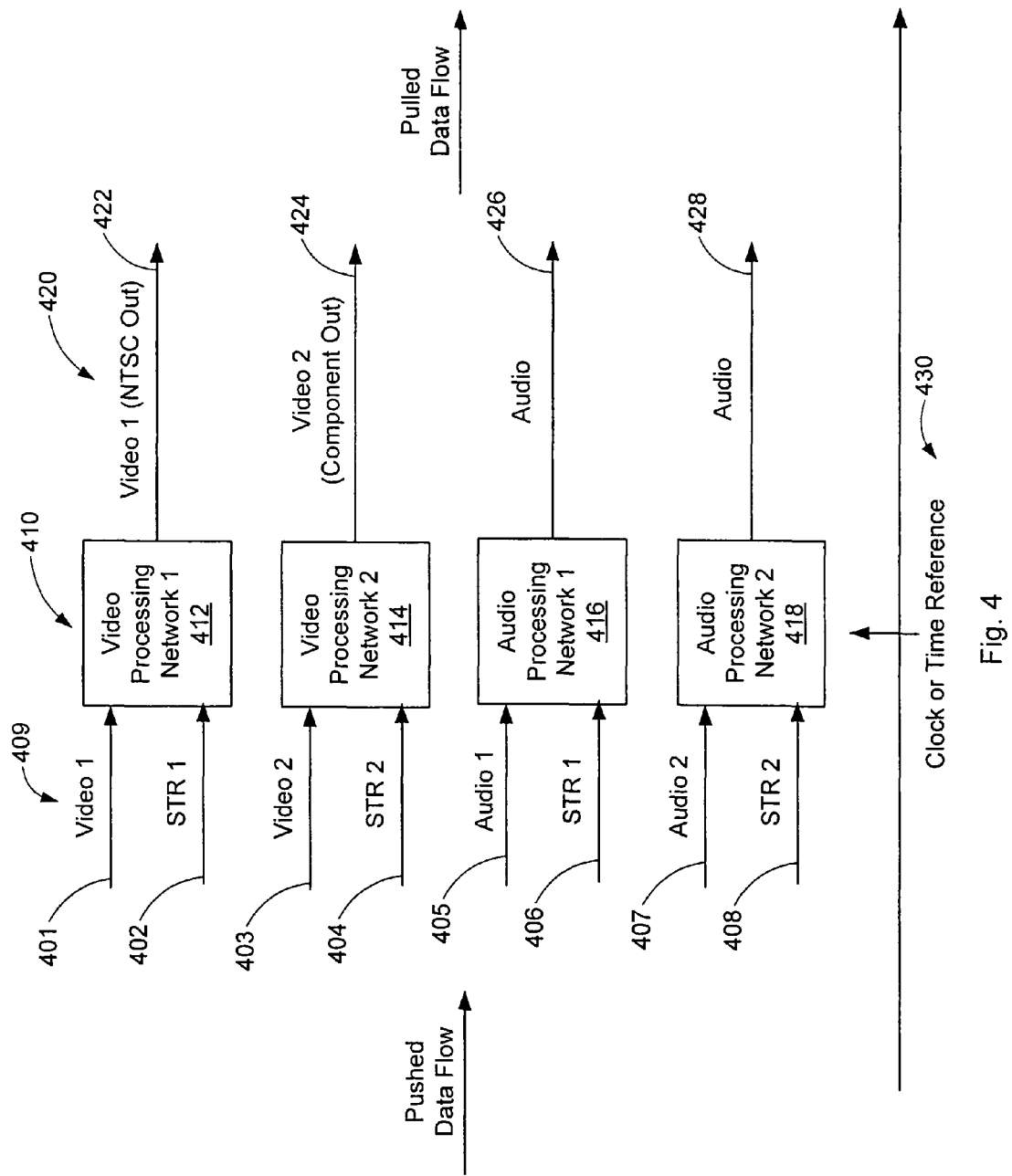
FIG. 4 illustrates a block diagram of an embodiment of the data processing device similar to that illustrated in FIGS. 2A and 2B, processing video data in accordance with the present invention.

FIG. 4 illustrates a block diagram of one embodiment of the data processing device, generally designated 410, similar to that illustrated in FIGS. 2A and 2B. In this embodiment, the processing device 410 is adapted to process audio and video data (at a fixed clock rate that is asynchronous to the time reference of the input stream) in accordance with one embodiment of the present invention using pushed data flow input streams, generally designated 409. In the illustrated embodiment, the decoder 410 comprises a plurality of video and audio processing networks. In FIG. 4 two video processing networks designated 412 and 414 respectively, and two audio processing networks designated 416 and 418 respectively, are illustrated. It should be appreciated that while only two video and audio processing networks are illustrated, more than two video and audio processing networks or different process networks are contemplated.

In this embodiment, each of the processing networks of the data processing device 410 receives one or more inputs, generally designated 409, in a pushed manner or mode and provides an output, generally designated 420 in a pulled manner or mode, where the output pixels or data is provided as requested. As illustrated, video processing network 412 receives a video stream and STR as inputs, designated 401 and 402 respectively, and provides one video output designated 422, NSTR out for example, in a pulled manner at a fixed clock rate. Likewise, video processing network 414 receives a video stream and STR as inputs, designated 403 and 404 respectively, and provides one video output designated 424, component out for example, in a pulled manner at a fixed clock rate. In one embodiment, the video decoders compare a time stamp (PTS/DTS) with the STR to determine when to decode each frame and provide an output at a fixed clock rate.

Further, FIG. 4 illustrates two audio processing networks, Audio 1 and 2, 416 and 418 respectively. As illustrated, audio processing network 416 receives an audio stream and STR as inputs, designated 405 and 406 respectively, and provides one audio output designated 426 in a pulled manner at a fixed clock rate. Further, audio processing network 418 receives an audio stream and STR as inputs, designated 407 and 408 respectively, and provides one audio output designated 428 in a pulled manner at a fixed clock rate. In one embodiment, the audio decoder compares a time stamp (PTS/DTS) with the STR to determine when to decode each frame.

In the illustrated embodiment, the entire video path is clocked from a single clock 430 (i.e. the fixed clock rate which may be a 135 MHz clock for example). The A/V decoder utilizes STR recovery, STC devices and rate managed output devices to match the video outputs to the input data rates as provided previously. The transport module includes STR recovery and maintains the STRs (STRs 402, 404, 406 and 408 are illustrated) for each input source (streams 401, 403, 405 and 407 are illustrated). In one embodiment, these STRs are broadcast or transmitted to the one or more rate managed output devices.

In one embodiment of the present invention, it is contemplated that data processing device 410 may output several different formats of audio and video. For example, video may be output as analog (composite and/or components), digital ITU 656 and/or digital DVI. Audio may be output as analog, digital SPDIF, and/or digital $I^2S$. The response time of the rate managed output devices keeps all the video and audio outputs tightly synchronized.

As provided previously, the A/V decoder of the present invention uses "pull" data flow. That is, data is pulled out of the data processing device as requested. In one embodiment, the video output path uses a video bus. Using a single 27 MHz crystal reference tends to reduce the number of clock domains.

Figure 5:
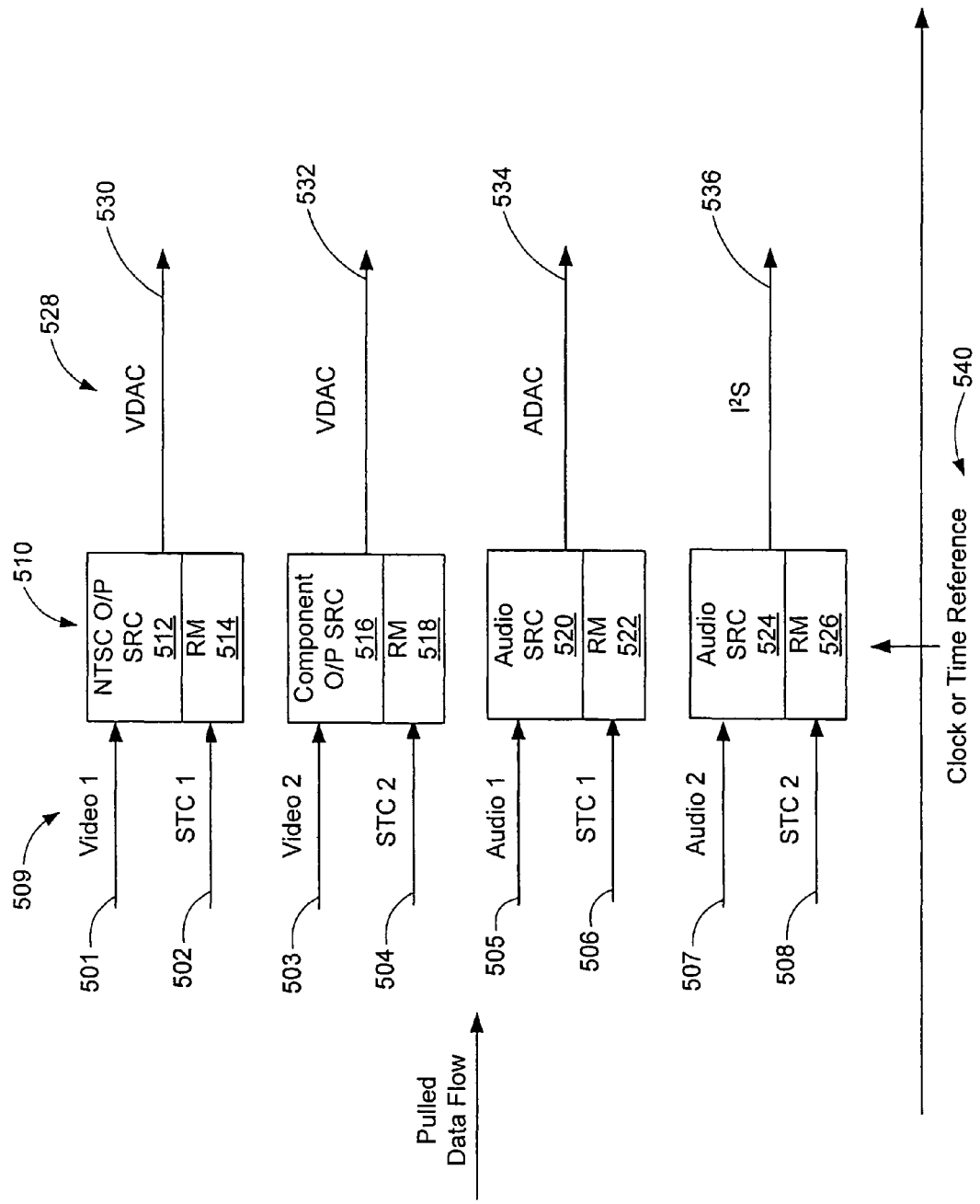
FIG. 5 illustrates a block diagram of an embodiment of the rate managed output device similar to that illustrated in FIGS. 2A and 2B, in accordance with the present invention.

FIG. 5 illustrates a block diagram of one embodiment of the rate managed output device 510 similar to that illustrated in FIGS. 2A and 2B using pulled data in accordance with the present invention. This device 510 includes an NSTR 0/P SRC device 512 with an attached or associated rate management output device 514 (alternatively referred to as an "RM device"), a component O/P SRC device 516 with an associated RM device 518, an audio SRC device 520 with an associated RM device 522, and an audio SRC device 524 and associated RM device 526. In one embodiment of the present invention, the one or more SRC devices adjust the output data rates to track the system time references.

In this embodiment, each of the illustrated modules of the data processing device 510 receives one or more inputs, generally designated 509, in a pulled manner and provides an output, generally designated 528. The NTSC/OP SRC 512 has one video input 501 and the attached RM has a STR input 502. The output is VDAC 530. Component O/P SRC 516 has a video input 503 while its attached RM has a STR input 504 and the output is VDAC 532. The audio SRC 520 has an audio input 505 while its attached RM 522 has a STR input 506 and the output is ADAC 534. The audio SRC 524 has an audio input 507 and its attached RM 526 has a STR input 508 and the output is $I^2s$ 536. All of the above modules are clocked from a single clock or time reference 540.

One embodiment of the present invention comprising a dual PLL structure uses a loop that locks the output sample rate to the system time reference. In this embodiment, the dual PLL comprising a digital PLL that recovers STR from the input timing references, is used to lock the output sample rates to the recovered STR. In this embodiment, the STR recovery PLL removes timing jitter and detects discontinuities, while the output rate manager PLL locks the output rate to the STR.

Figure 6:
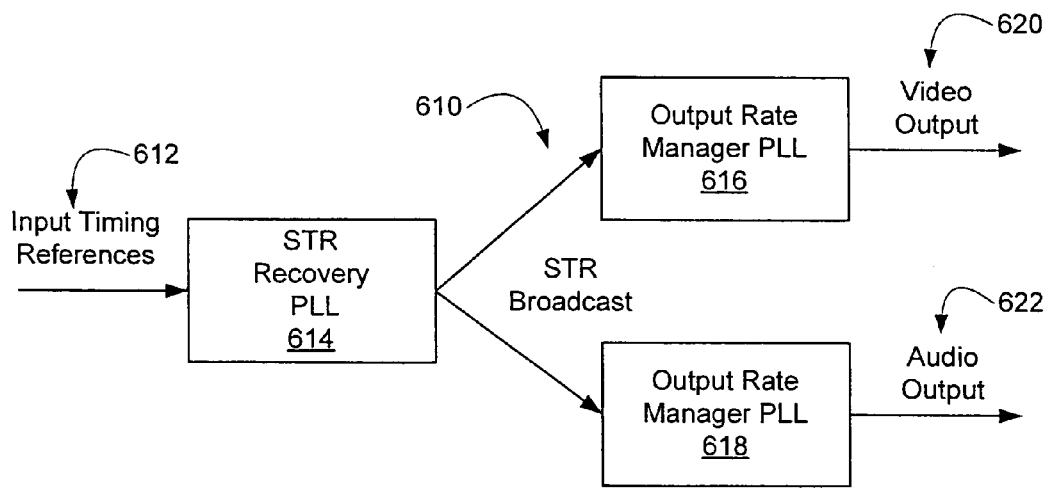
FIG. 6 illustrates a block diagram of one embodiment of a loop that locks the output sample rate to a system time reference comprising a dual PLL in accordance with the present invention.

FIG. 6 illustrates one embodiment of a loop generally designated 610, that locks the output sample rate to the system time references. In this embodiment, a digital STR recovery PLL 614 recovers the STR from the input timing references 612. FIG. 6 illustrates the STR recovery PLL 614 communicating with dual PLLs, output rate manager PLLs 616 and 618 (alternatively referred to as "second-level PLLs") using an STR broadcast. In one embodiment, the STR recovery PLL 614 removes timing jitter and detects discontinuities.

In one embodiment, the video and audio output data 620 and 622 respectively are output by one or more STRs where the output rate is managed by the output rate managers PLLs 616 and 618 and are locked to the STR. In this embodiment, the STR recovery PLL 614 is used to detect timing discontinuities and errors. If the STR recovery PLL 614 detects a discontinuity, it locks to the new time base and notifies the second-level PLLs of the discontinuities. This ensures that both the video and audio outputs 620 and 622 will have similar responses to the discontinuity.

It is contemplated that the audio and video may be output in several different formats. Video may be output as analog data (composite and/or components), digital ITU 656 and/or digital DVI. Audio may be output as analog, digital SPDIF, and/or digital $I^2S$. The response time of the output PLLs maintain tightly synchronization for the outputs. The STR recovery PLL 614 is used to remove jitter from the time references as previously provided. Because the jitter may be large and the time references relatively infrequent, the STR recovery PLL 614 has a very slow response to changes at the input. The output rate manager PLLs 616 and 618 however receives the jifter-free STR from the STR recovery PLL 614. The output rate manager PLLs 616 and 618 have a faster response time (in comparison to the STR recovery PLL) and quickly track changes. In this manner, the audio and video outputs 620 and 622 quickly and closely track the STR from the STR recovery PLL 614. It is contemplated that the video and audio outputs are tightly synchronized.

If each output PLL 616 and 618 were locked directly to the input timing reference 612, the output PLLs would have a slow response time. The audio and video outputs 622 and 620 would not be tightly synchronized, and there might be large timing differences between different outputs.

It is contemplated that the STR recovery PLL 614 is a convenient place to add CPU control of the A/V decoder. The CPU (not shown) may be used to adjust the STR recovery PLL 614, such that all outputs automatically (and synchronously) track the changes. Changes to the STR may be useful for personal video recorder (alternatively referred to as "PVR") operation or for STR-based modes like pause and fast forward.

In accordance with the present invention, STR recovery devices are used to convert one or more A/V input samples from system time reference or STR rates to the system clock. Note that the STRs and the system clock may be different, and are independent and not locked (i.e., they are asynchronous).

It is contemplated that STRs and the clocks may drift apart slowly over time. In accordance with one embodiment, the STR device must adjust for any differences between the STRs and the system clock.

It is contemplated that known VCXO-based video systems perform STR recovery and broadcast functions. In fact, rate manage-based A/V video systems (i.e., A/V systems having a rate managed output device in accordance with embodiments of the present invention) may perform some of the functions performed by VCXO-based video systems. Some common functions may include: (1) filtering input timing signals to remove timing jitter; (2) using STR recovery to detect and ignore possible timing glitches or bit errors; (3) using STR recovery to detect possible timing discontinuities (e.g., PCR/SCR discontinuities or change of hsync/vsync.); (3) using a main CPU to directly control the STR to implement PCR-based trick modes or enable PVR functions; and (4) performing STR recovery on, for example, MPEG PCR/SCR stamps, VDEC hsync/vsync signals, ITU656 timing, or free-running the STR (for playback from disk).

Figure 7:
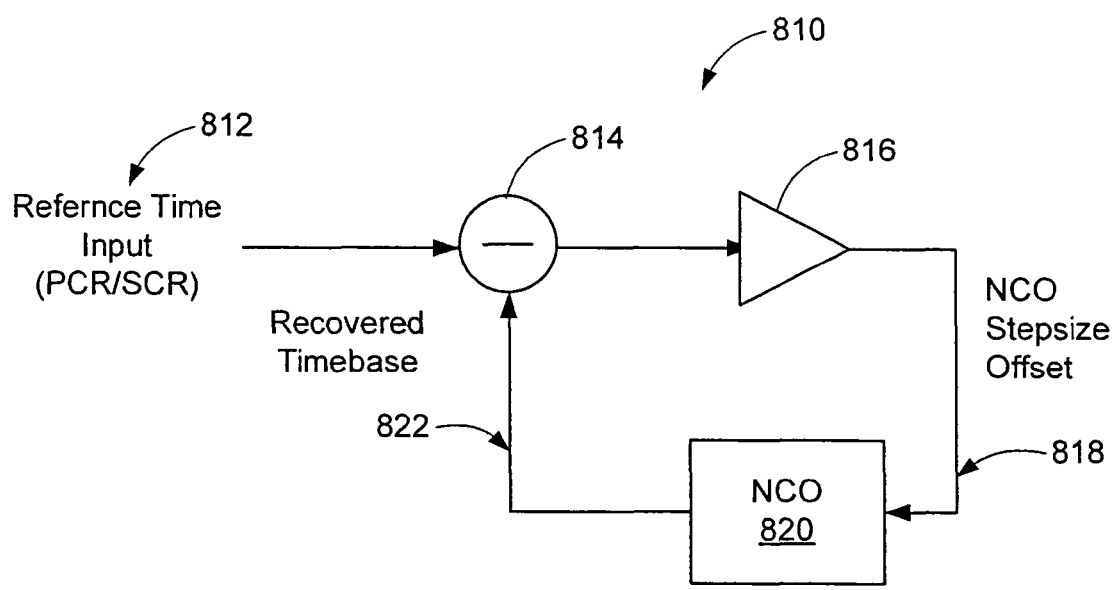
FIG. 7 illustrates one embodiment of an NCO based clock recovery device in accordance with the present invention.

In accordance with one embodiment of the present invention, STR recovery may be accomplished utilizing a PLL, for example a STR recovery PLL as provided previously with respect to FIG. 6. In one embodiment, the STR recovery PLL is a digital PLL including at least one digital NCO. FIG. 7 illustrates one embodiment of a STR recovery device adapted to output one or more recovered STR signals, generally designated 810. In this embodiment, the STR recovery device 810 comprises a digital PLL generating one or more timebase signals. In one embodiment, an NCO device 820 generates one or more timebase signals (designated 822 in FIG. 7). The STC recovery device 810 compares the one or more recovered timebase signals 822 (PCR/STR signals for example) with one or more referenced input time signals 812 using comparator 814. A filter 816 (a $1^{st}$ order IIR filter for example) outputs one or more NCO stepsize offset signals 818 (having a stepsize value of "1" for example). NCO device 820 (a digital NCO device) receives the one or more NCO stepsize offset signals 818, outputting one or more recovered timebase signals 822 that are compared and locked to the referenced time input signals 812. The recovered timebase signals may be output to the A/V system. Again it is contemplated that this device may be employed on a limited basis or may be employed continuously (i.e., in a repetitive fashion).

Figure 8:
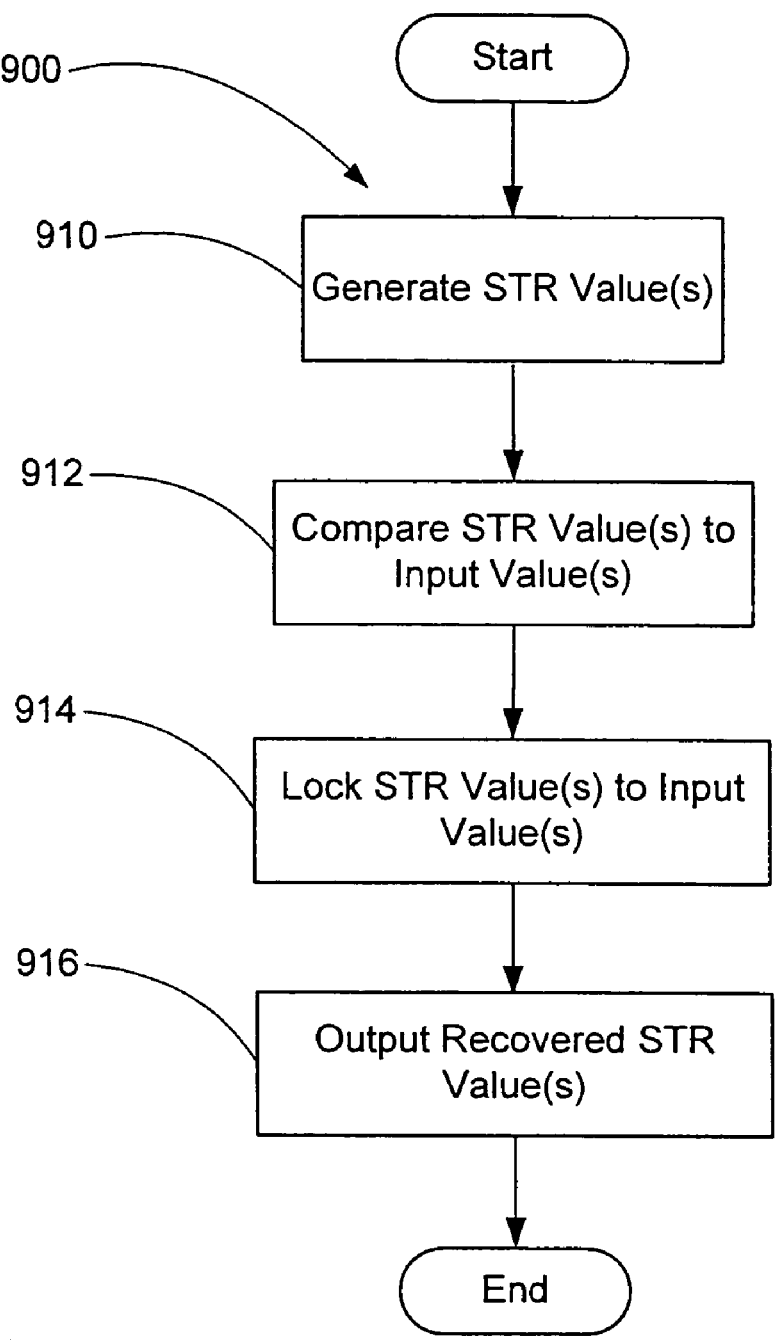
FIG. 8 illustrates one embodiment of a flow diagram for recovering one or more STR values in accordance with the present invention.

FIG. 8 illustrates one embodiment of a method, generally designated 900, for recovering one or more STR values in accordance with the present invention. In this embodiment, one or more STR values or signals are generated, using an STR generator (an accumulator or digital NCO for example) as illustrated by block 910. Such STR values are compared against the reference input or timebase values (received from an input stream for example) as illustrated by block 912 using a comparator in one embodiment. The STR values are locked to the input values (using an accumulator or digital NCO for example) as illustrated by block 914. The recovered STR values are output as illustrated by block 916.

Figure 9:
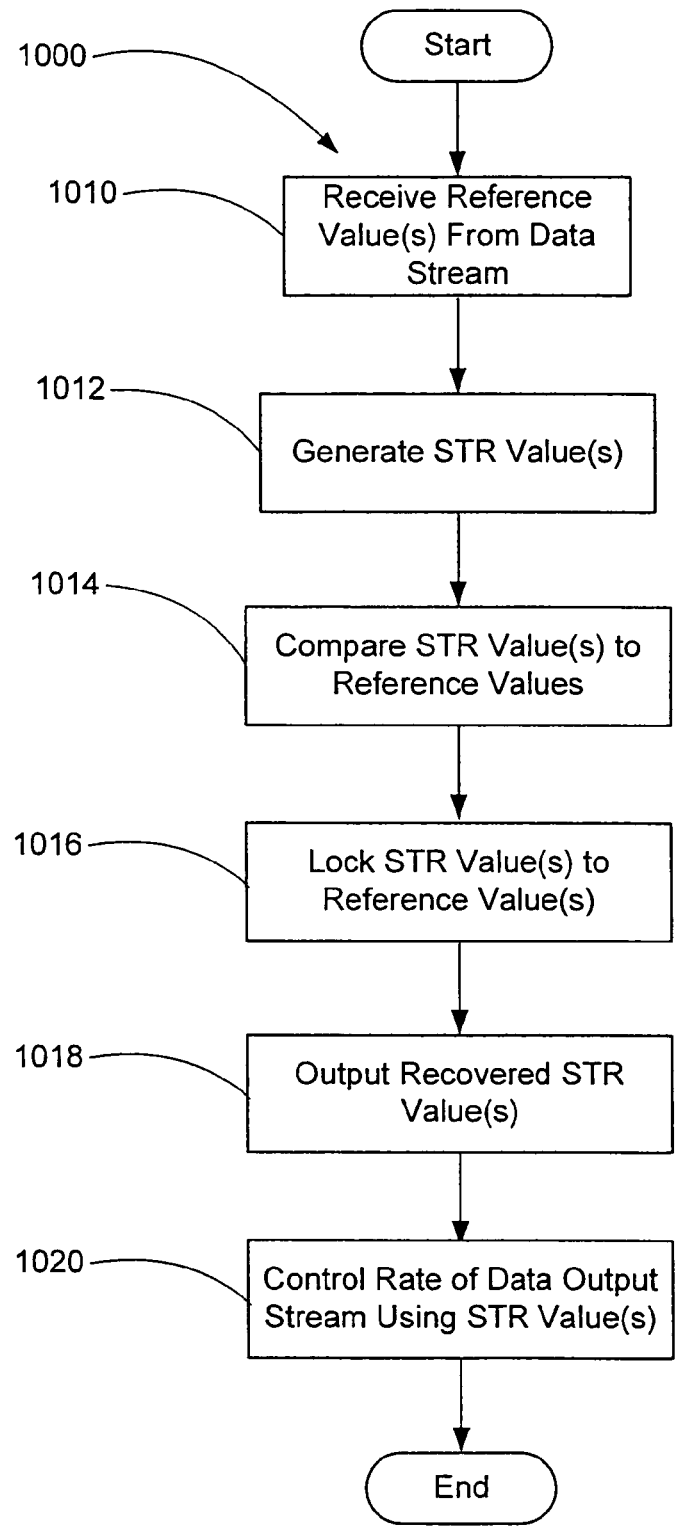
FIG. 9 illustrates one embodiment for controlling a rate of a data output stream using one or more STR values in accordance with the present invention.

FIG. 9 illustrates one embodiment for controlling a rate of a data output stream, generally designated 1000, using one or more recovered STR values in accordance with the present invention. In this embodiment, one or more reference values are received from an input data stream as illustrated by block 1010. In one embodiment, the reference values (i.e., timebase or reference time input signals) are received (from the input data stream for example). One or more STR values or signals are generated, using an STR generator (a digital NCO for example) as illustrated by block 1012. Such STR values are compared with the reference values as illustrated by block 1014.

The STR values are locked to the reference values as illustrated by block 1016. In one embodiment, one or more NCO stepsize values or signals are generated, which are used to lock the STR values to the reference values. The recovered STR values are output as illustrated by block 1018. The method then controls the rate of the data output stream using the one or more recovered STR values as illustrated by block 1020.

It is contemplated that, under some conditions, an A/V decoder in accordance with one embodiment may not have a reliable time reference (e.g. playback from disk, playback over a network or a non-MPEG format). The A/V decoder should be adapted to operate in an "unlocked" mode. In such unlocked mode, the STR recovery device runs from a fixed crystal clock (depending on the crystal frequency, the NCO stepsize may not be "1" as provided previously). The STR recovery device continues to broadcast STR values or signals, and the output rate managers lock the output rates to the STR broadcast. It is contemplated that, in unlocked mode, the output rate managers still lock to the STR broadcast to maintain A/V sync.

Figure 10:
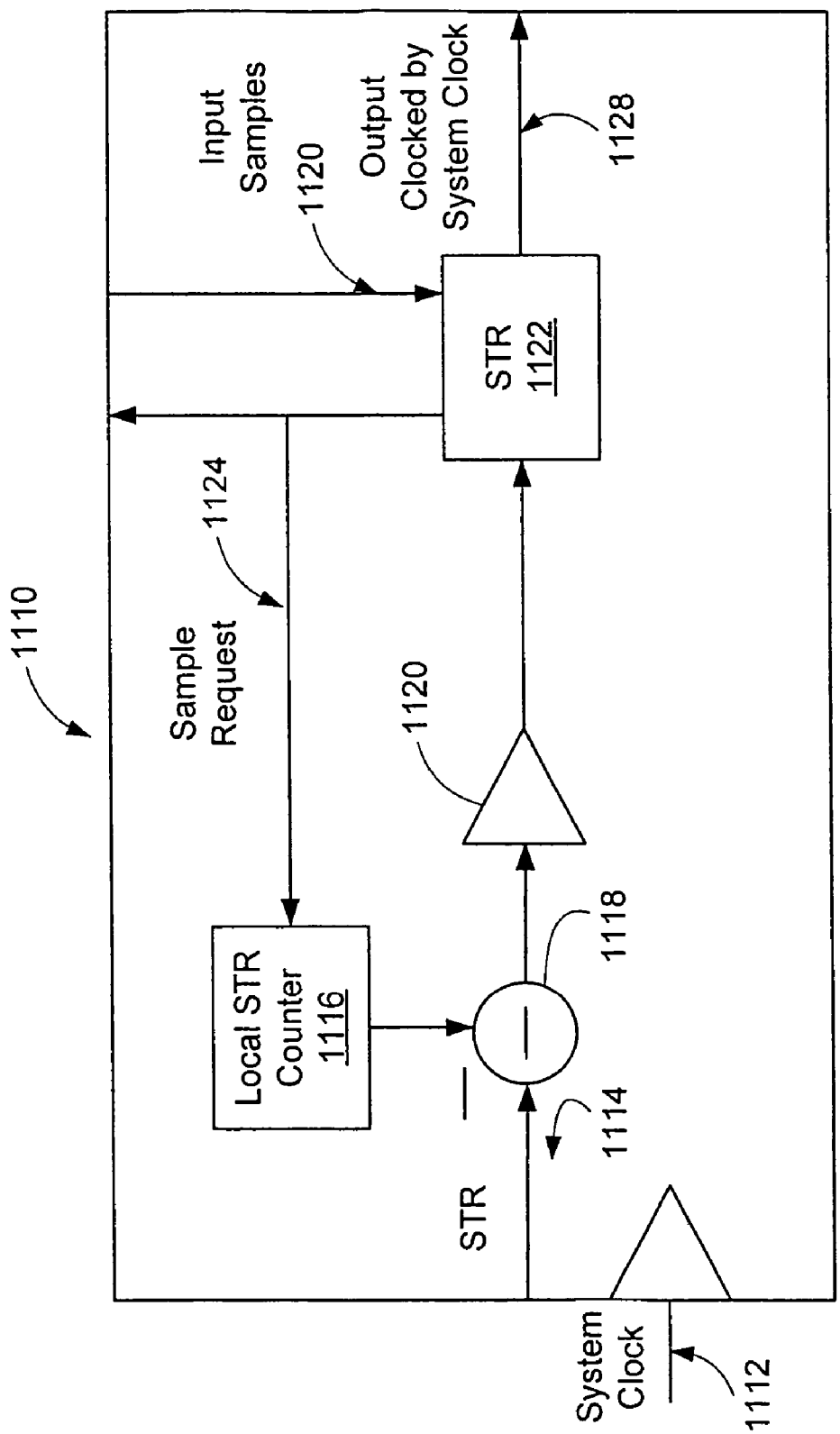
FIG. 10 illustrates one embodiment of a block diagram of a closed loop control device adapted to control or manage an STC recovery device in accordance with the present invention.

FIG. 10 illustrates one embodiment of a block diagram of a control or management system or device adapted to control or manage an STR device similar to the STR devices provided previously. It is contemplated that each output of the STR device is locked to an STR using a rate controlled or rate managed output device or module, generally designated 1110. The output sample rate is compared to the STR signals or values, and the output rate is adjusted accordingly using such rate controlled or managed output. This control or managed output is, in one embodiment, a PLL similar to STR recovery PLL provided previously and illustrated in FIG. 6.

In the embodiment illustrated in FIG. 10, the rate controlled or managed output device 1110 has one or more inputs. In the illustrated embodiment, loop 1110 receives one or more STR and system clock signals or values, designated 1114 and 1112 respectively. The STR rate controlled or managed output device 1110 maintains a local STR counter 1116 that increments every time a sample request 1124 is received. The rate controlled or managed output device 1110 compares the value of the local STR counter 1116 with the one or more STR values 1114 using a comparator 1118, and adjusts the STR device 1122 appropriately, in one embodiment using LPF 1120.

As illustrated, the STR 1122 receives one or more input signals 1126 and outputs one or more sample requests 1124 to the local STR counter 1116. Furthermore, the STR device 1122 outputs one or more output values or signals 1128 clocked by the system clock 1112.

In the embodiment illustrated in FIG. 10, the output is high-definition video with a nominal sample rate, 74.25 MHz for example. The STR is, in this embodiment, defined by MPEG to represent a 27 MHz clock. The STR rate controlled or managed output device 1110 is a digital PLL that locks the sample request rate to the STR. In this embodiment, the sample rate is related to the STR by 27/74.15=4/11 for example. The STR rate controlled or managed output device 1110 maintains the local STR counter 1112 that increments by 4/11 for example every time a sample is requested. The rate controlled or managed output device 1110 compares the values of the local STR counter with the STR, and adjusts the STR device 1122 appropriately using LPF 1120.

It is contemplated that one embodiment of such loop 1110 works with any clock or time reference. For example, assume the system clock is 108 Mhz. When the loop is locked, the STR device outputs 74.25/108=11/16 samples every clock pulse. In other words, the STR recovery device requests 11 input samples every 16 system clock pulses. When the loop is locked, the rate control signal represents 11/16.

Additional detail regarding an NCO system and method that may be used in connection with the present invention is provided in U.S. patent application Ser. No. 10/133,461 filed Apr. 26, 2002, titled "An NCO with Rational Frequency and Normalized Phase", the complete subject matter of which is incorporated herein by reference in its entirety.

Many modifications and variations of the present invention are possible in light of the above teachings. Thus, it is to be understood that, within the scope of the appended claims, the invention may be practiced otherwise than as described hereinabove.

The invention claimed is:

1. A method for recovering a time reference in an A/V system comprising:
   (a) receiving at least one input time stamp based on an input clock rate;
   (b) generating one or more NCO stepsize offset signals;
   (c) generating at least one time reference value representative of said at least one input time stamp using an NCO, wherein said one or more NCO stepsize offset signals are a function of the difference between the at least one input time stamp and the at least one time reference value, wherein the one or more NCO stepsize signals comprise at least one filtered difference between the at least one input time stamp and the at least one time reference value; and
   (d) outputting said at least one generated time reference value.

2. The method of claim 1, comprising repeating steps (a) through (d).

3. The method of claim 1, wherein said time reference value is generated using said NCO and a digital PLL.

4. The method of claim 1, wherein said time reference value is a system time reference value.

5. The method of claim 4 comprising comparing said system time reference value to said time stamp.

6. The method of claim 4 comprising locking said system time reference value to said time stamp, forming at least one recovered system time reference value.

7. The method of claim 1, wherein the time stamp comprises a program clock reference value.

8. The method of claim 1, wherein the time stamp comprises a presentation time stamp.

9. The method of claim 1, wherein generating at least one time reference value representative of said at least one input time stamp using an NCO, said one or more NCO stepsize offset signals being not synchronized with said input clock rate, further comprises generating at least one time reference value representative of said at least one input time stamp using an NCO, said one or more NCO stepsize offset signal being based on an HSYNC signal.

10. A method of processing data in a data stream using an A/V decoder comprising:
    (a) receiving at least one input time stamp from the data;
    (b) generating one or more NCO stepsize offset values;
    (c) generating at least one system time reference value using an NCO device and said one or more NCO stepsize offset values, wherein the NCO stepsize values are a function of the difference between the at least one input time stamp and the at least one system time reference value, wherein the one or more NCO stepsize signals comprise at least one filtered difference between the at least one input time stamp and the at least one time reference value;
    (d) comparing said system time reference value to said input time stamp;
    (e) locking said system time reference value to said input time stamp, forming at least one recovered system time reference value;
    (f) outputting said recovered system time reference value; and
    (g) processing the data using at least one clock not synchronized with said recovered system time reference value.

11. The method of claim 10, comprising repeating at least steps (a) through (f).

12. A method of processing data in a data stream using an A/V decoder comprising:
    (a) receiving at least one input time stamp from the data;
    (b) generating at least one system time reference value;
    (c) comparing said system time reference value to said input time stamp;
    (d) locking said system time reference value to said input time reference value, forming at least one recovered system time reference value, wherein the NCO stepsize values are a function of the difference between the at least one input time stamp and the at least one system time reference value, wherein the one or more NCO stepsize signals comprise at least one filtered difference between the at least one input time stamp and the at least one time reference value;
    (e) processing the data using a clock not synchronized with said recovered system time reference value; and
    (f) outputting said recovered system time reference value.

13. The method of claim 12, comprising repeating steps (a) through (e).

14. The method of claim 12, wherein said system time reference value is generated using an NCO device.

15. The method of claim 12, further comprising generating one or more offset values.

16. The method of claim 15, wherein an NCO device uses said offset values to generate said system time reference values.

17. The method of claim 12, further comprising providing the processed data using the clock not synchronized with said recovered system time reference value to a digital to analog converter.

* * * * *